(12) United States Patent
Oh et al.

(10) Patent No.: US 8,107,260 B2
(45) Date of Patent: Jan. 31, 2012

(54) EMI SHIELDING AND ENVIRONMENTAL SEAL DEVICE

(75) Inventors: Hieyoung W. Oh, Bowdoing, ME (US); Adam H. Willwerth, North Yarmouth, ME (US)

(73) Assignee: Illinois Tool Works Inc., Glenview, IN (US)

( * ) Notice: Subject to any disclaimer, the term of this patent is extended or adjusted under 35 U.S.C. 154(b) by 530 days.

(21) Appl. No.: 12/268,164

(22) Filed: Nov. 10, 2008

(65) Prior Publication Data

US 2009/0129043 A1 May 21, 2009

Related U.S. Application Data

(60) Provisional application No. 60/988,215, filed on Nov. 15, 2007.

(51) Int. Cl.
*H05K 9/00* (2006.01)
(52) U.S. Cl. .......................... 361/818; 361/800; 343/841
(58) Field of Classification Search .................. 361/753, 361/799, 800, 818; 343/878–882, 841; 174/50, 174/520, 539, 564, 350–397; 439/607.01–607.05
See application file for complete search history.

(56) References Cited

U.S. PATENT DOCUMENTS

| | | | | |
|---|---|---|---|---|
| 4,308,417 A | * | 12/1981 | Martin | 174/374 |
| 4,894,489 A | * | 1/1990 | Takahashi et al. | 174/366 |
| 4,948,922 A | * | 8/1990 | Varadan et al. | 174/353 |
| 5,522,602 A | * | 6/1996 | Kaplo et al. | 277/650 |
| 5,661,356 A | | 8/1997 | Fisher | |
| 6,278,061 B1 | * | 8/2001 | Daoud | 174/659 |
| 6,784,363 B2 | * | 8/2004 | Jones | 174/351 |
| 7,136,271 B2 | | 11/2006 | Oh et al. | |
| 7,193,836 B2 | | 3/2007 | Oh et al. | |
| 2002/0090506 A1 | * | 7/2002 | Protzner et al. | 428/334 |
| 2003/0173100 A1 | * | 9/2003 | Flaherty et al. | 174/35 GC |
| 2006/0007609 A1 | | 1/2006 | Oh et al. | |
| 2006/0018098 A1 | * | 1/2006 | Hill et al. | 361/708 |
| 2006/0260838 A1 | * | 11/2006 | Ariel | 174/350 |
| 2007/0040459 A1 | | 2/2007 | Oh | |

FOREIGN PATENT DOCUMENTS

| | | |
|---|---|---|
| DE | 4221479 A1 | 1/1994 |
| EP | 1523086 A | 5/2005 |
| JP | 04368446 A | 12/1992 |
| JP | 2005151749 A | 6/2005 |
| WO | 97/01200 A | 1/1997 |

OTHER PUBLICATIONS

EP Search Report dated Apr. 6, 2009 for Application Serial No. 08168952.3-1242.

* cited by examiner

*Primary Examiner* — Angel R Estrada
*Assistant Examiner* — Dimary Lopez
(74) *Attorney, Agent, or Firm* — Taylor IP, P.C.

(57) ABSTRACT

An EMI shield for a movable component such as an antenna of an electronic device includes a microfiber ring of densely packed microfibers extending from an EMI shielding housing across the space defined by an opening in the housing for the movable component. Multiple microfiber rings can be used separated by spacers, and an environmental shield can be included.

14 Claims, 3 Drawing Sheets

EMI SHIELDING AND ENVIRONMENTAL SEAL DEVICE

CROSS-REFERENCE TO RELATED APPLICATIONS

The present application claims the benefits of U.S. Provisional Application Ser. No. 60/988,215 filed on Nov. 15, 2007.

FIELD OF THE INVENTION

The present invention relates EMI shielding devices, and, more particularly, to EMI shielding and environmental seal devices for electronic devices having externally movable parts, such as, for example, retractable antennas, rotating antennas, and the like.

BACKGROUND OF THE INVENTION

Electromagnetic radiation emitted from an external source can cause disturbances to an electrical circuit. Such disturbances are known as electromagnetic interference (EMI) or radiofrequency interference (RFI). The performance of the circuit may be interrupted, obstructed or otherwise degraded or limited by EMI. A variety of different objects may be the source of EMI, and may be naturally occurring or man-made.

EMI shielding consisting of conductive material surrounding an electronic device is used to create a Faraday cage which prevents electronic signals from penetrating into the enclosed space. Any opening, such as may exist around components that extend outwardly of the cage may create a break in the condition of the Faraday cage, and thereby undesirably allow the passing or emitting of interfering signals.

Components that extend outwardly of a main housing structure of an electronic device present particular problems when the component is movable relative to the main housing structure. Antennas are used to receive and transmit electromagnetic signals for the operation of electronic devices including televisions, radios, computers, medical instruments, business machines, communications equipment and the like. It is known for an antenna to be movable in one way or another relative to the main structure of the electronic device in which it operates. For example, antennas are known to be extendable and or rotatable relative to an electronic device, and therefore are the source of gaps in the EMI shielding of the device. Various types of conductive O-rings or elastic gaskets are known to be used around antennas or other movable components with some effectiveness. However, the integrity of such sealing devices can be compromised over time, diminishing the EMI shielding of the device. Further, the sealing devices may have inadequate flexibility to conform to the differing shape of an extendable antenna, for example.

What is needed in the art is a seal around externally movable parts of electronic devices that provides both EMI shielding and environmental sealing between the movable component and the main structure of the electronic device.

SUMMARY OF THE INVENTION

A shield and seal is provided consisting of densely packed conductive microfibers to create both an EMI shield and an environmental seal around a movable part in an electronic device.

In one aspect of one form thereof, the present invention provides an EMI shield for a device, the EMI shield having an electrically conductive housing defining an opening; a microfiber ring connected to the housing; and the microfiber ring having densely packed microfiber filaments electrically connected to the housing and extending into the opening.

In another aspect of another form thereof, the present invention provides an EMI shielding and environmental sealing device for an electronic device having an antenna. The EMI shielding and environmental sealing device has a cup with a side and a base. An environmental seal is restrained in the cup; and an EMI shield is restrained in the cup between the base and the environmental shield. The EMI shield includes a microfiber ring of densely packed microfibers in contact with the side and with the antenna.

In a further aspect of a further form thereof, the present invention provides an electromagnetically shielded device having a movable component, with an electrically conductive housing defining an opening having the movable component of the device extending out of the housing through the opening. An electrically conductive cup is secured in the opening, the cup having a side, a base on one edge of the side, and a lip on an opposite edge of the side. An environmental seal in the cup is restrained between the base and the lip; and an EMI shield is restrained the cup between the base and the lip. The EMI shield includes a ring of densely packed microfibers in contact with the side and with the movable component.

An advantage of the present invention in one aspect thereof is providing a continuous electromagnetic shield adjacent movable parts to block or inhibit the transmission of interference signals.

A further advantage of the present invention in a further aspect thereof is providing a long lasting environmental seal and electromagnetic shield adjacent a movable component of an electronic device.

Yet another advantage of the present invention in yet another aspect thereof is providing an EMI shield that readily conforms to the differing shape or size of a movable component, such as an antenna.

Other features and advantages of the invention will become apparent to those skilled in the art upon review of the following detailed description, claims and drawings in which like numerals are used to designate like features.

Figure 1:
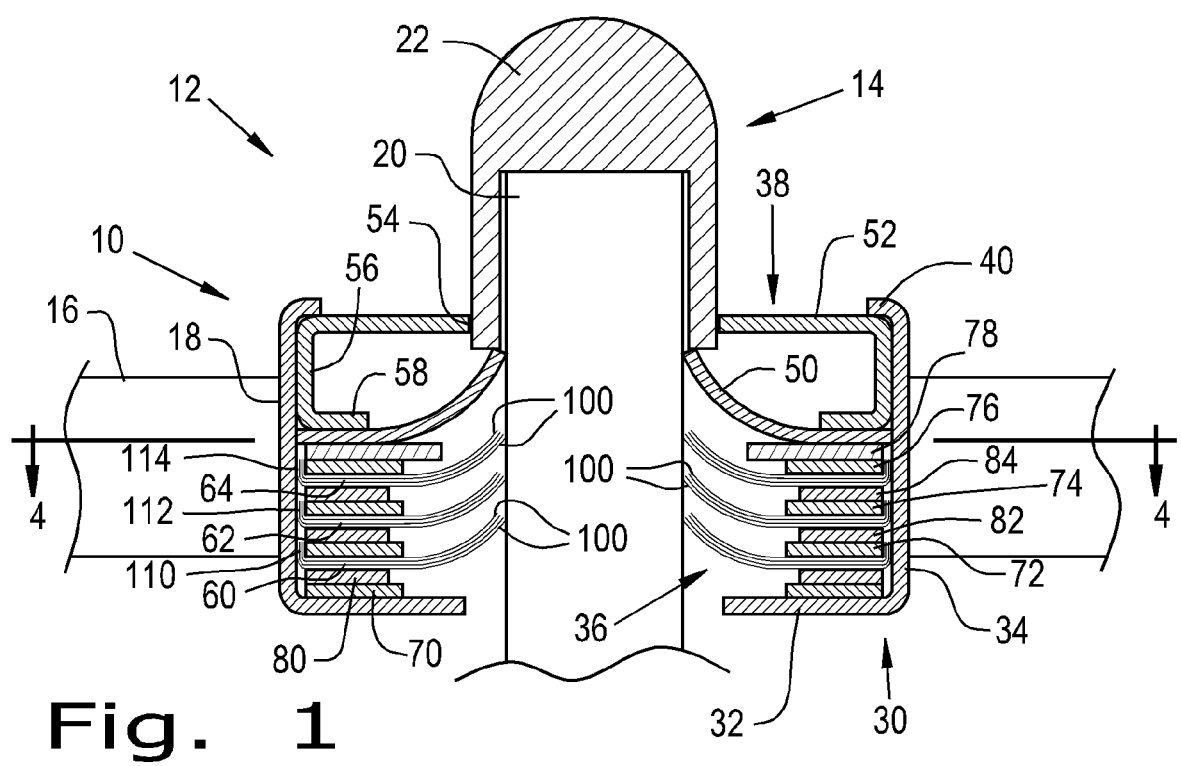
FIG. 1 is a fragmentary cross-sectional view of an antenna having an EMI shield and environmental shield in accordance with one embodiment of the present invention, the antenna being shown in a retracted position.

Before the embodiments of the invention are explained in detail, it is to be understood that the invention is not limited in its application to the details of construction and the arrangements of the components set forth in the following description or illustrated in the drawings. The invention is capable of other embodiments and of being practiced or being carried out in various ways. Also, it is understood that the phraseology and terminology used herein are for the purpose of description and should not be regarded as limiting. The use herein of "including", "comprising" and variations thereof is meant to encompass the items listed thereafter and equivalents thereof, as well as additional items and equivalents thereof.

DETAILED DESCRIPTION OF THE PREFERRED EMBODIMENT

Referring now more specifically to the drawings and to FIG. 1 in particular, an exemplary EMI shielding and environmental seal device 10 is shown as part of an electronic device 12 which further includes an antenna 14. Antenna 14 is a retractable and extendable antenna that can be used for a radio, television, communications device, computer or other device. Antenna 14 also may be rotatable in addition to being retractable and extendable.

EMI shielding and environmental seal device 10 is mounted in a housing 16 which forms a Faraday cage or other sealing closure of electronic device 12. EMI shielding and environmental seal device 10 continues and extends the shielding effect of the Faraday cage established by housing 16 through a space or opening 18 defined in housing 16 through which antenna 14 extends. EMI shielding and environmental seal device 10 provides both a continuation of the Faraday cage and electronic shielding as well as environmental sealing against contaminant intrusion.

Figure 2:
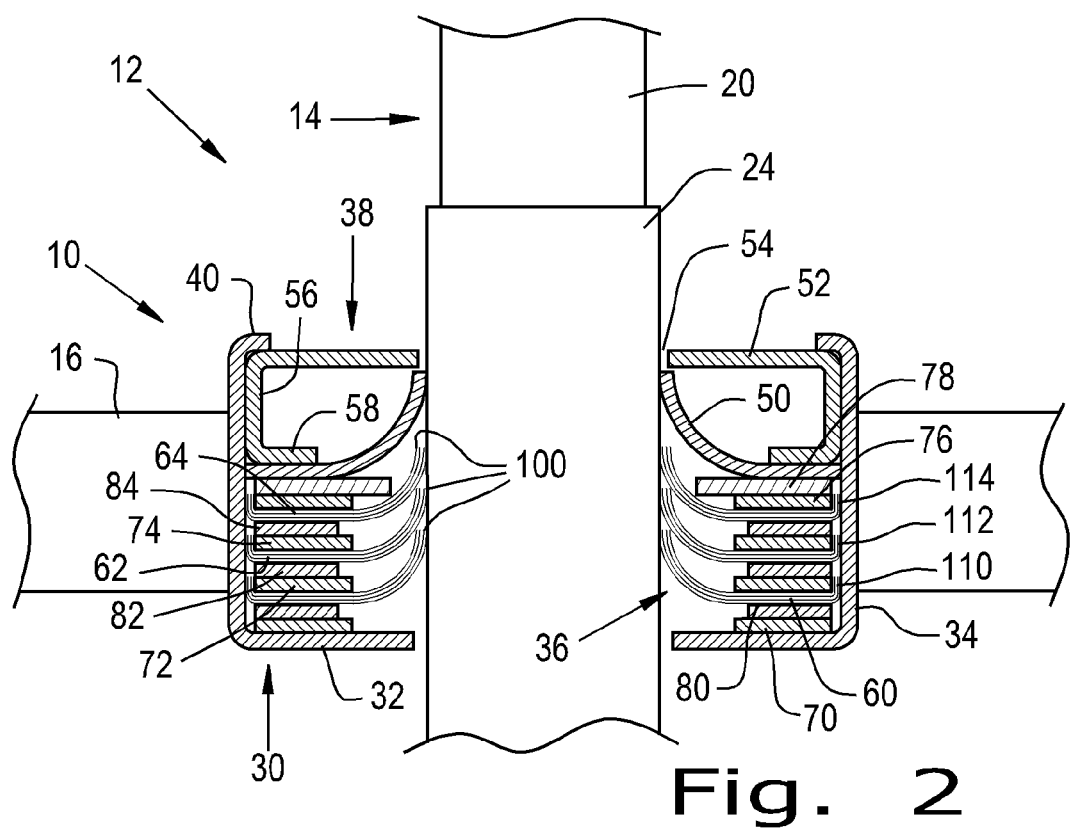
FIG. 2 is a fragmentary cross-sectional view similar to that shown in FIG. 1, but illustrating the antenna in an extended position.
Figure 3:
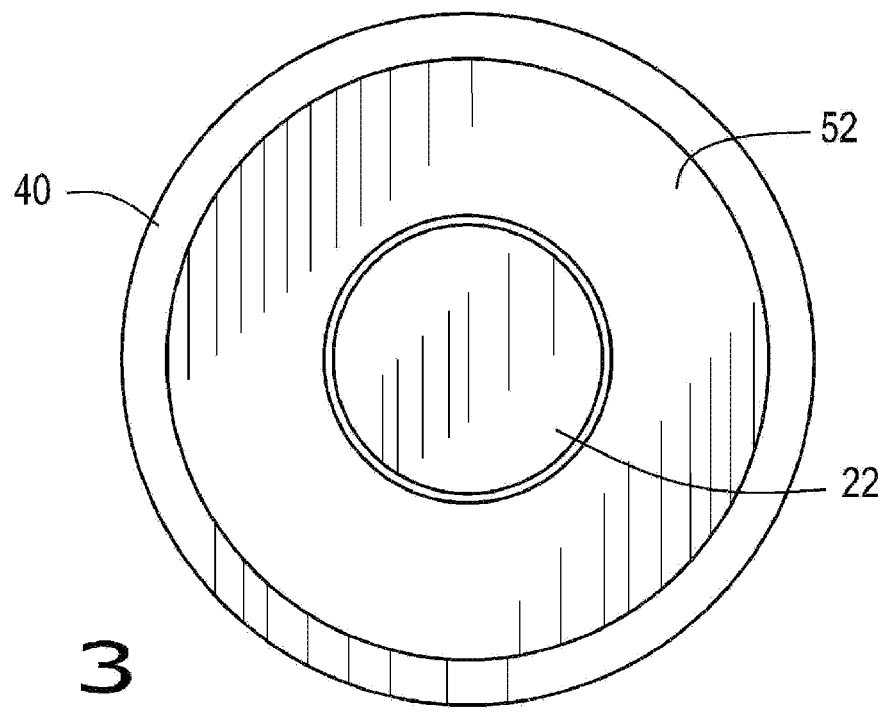
FIG. 3 is an end view of the antenna shown in FIG. 1.
Figure 4:
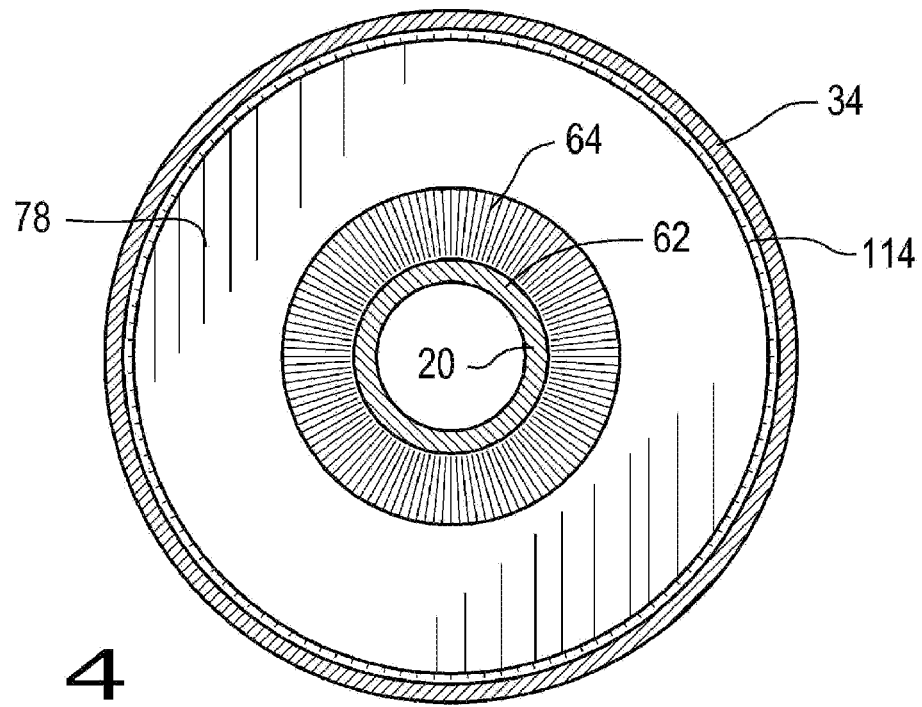
FIG. 4 is a cross-sectional view of the antenna shown in FIG. 1, taken along line 4-4 of FIG. 2.

Antenna 14 includes a distal portion 20 having a cap 22 or other end thereon at its distal tip, and a proximal portion 24 telescopically receiving distal portion 20. While only two portions are shown, distal portion 20 and proximal portion 24, it should be understood that antenna 14 can include even more portions each telescopically received one within another. Antenna 14 is extended by pulling adjacent telescopically received portions outwardly relative to one another, and is retracted by pushing adjacent telescopically received portions one into the other. In the exemplary embodiment shown, device 10 encircles distal portion 20 when antenna 14 is in the retracted position as shown in FIG. 1, and device 10 encircles proximal portion 24 when antenna 14 is in the extended position as shown in FIG. 2. Device 10 provides an effective shield and seal across opening 18 even as the diameter of antenna 14 changes between distal portion 20 and proximal portion 24. However, it should be understood that EMI shielding and environmental seal device 10 also can be used advantageously even when encircling an axially movable element of consistent diameter, a rotatable or other movable element or even a static, non-movable element. While having advantages over known shielding and sealing devices when used for movable components of changing shape, the present invention is not limited to such applications and can be used advantageously for shielding and sealing other devices as well.

EMI shielding and environmental sealing device 10 includes an electrically conductive cup 30, which may be metal, such as, for example, aluminum, electrically conductive plastics, or other electrically conductive materials. Cup 30 in the exemplary embodiment is substantially annular and closed at one end, thereby having a base 32 and an annular side 34. An electromagnetic shield 36 and environmental seal 38 are arranged in cup 30 and are retained therein by an inwardly folded lip 40 of cup 30 on the opposite edge of side 34 from base 32. Accordingly, shield 36 and seal 38 are constrained axially between base 32 and lip 40.

Seal 38 is provided on the ambient side of device 10 as a barrier to contaminants, moisture and the like. Seal 38 includes a flexible membrane 50 of rubber, thermoplastic or other material and is of sufficient width so that the inner diameter thereof is in contact with antenna 14 which slides there through during axial movement of antenna 14 when being extended or retracted. A cover 52 is provided between membrane 50 and lip 40. Cover 52 defines an opening 54 of sufficient diameter to receive cap 22. Cover 52 protects shield 36 and seal 38 and provides a first level shield and seal across opening 18 between housing 16 and antenna 14. Cover 52 can be constructed to have some a thickness by including a side 56 generally adjacent side 34 of cup 30, and an inwardly extending flange 58 against membrane 50.

Shield 36 includes stacked layers of microfiber rings 60, 62, 64 and spacers 70, 72, 74, 76 between base 32 and membrane 50. In the exemplary embodiment shown, shield 36 includes three microfiber rings 60, 62, 64 and four spacers 70, 72, 74, 76. However, it should be understood that fewer rings and spacers, or more rings and spacers can be used as desired or as necessary to achieve the desired shielding effect. In the exemplary embodiment shown, a first spacer 70 is provided between base 32 and a first ring 60; a second spacer 72 is provided between first ring 60 and a second ring 62; a third spacer 74 is provided between second ring 62 and a third ring 64; and a fourth spacer 76 is provided between third ring 64 and an additional, larger spacer 78 supporting membrane 50. Adhesive layers 80, 82, 84 can be used to interconnect and adhere microfiber rings 60, 62, 64 and spacers 70, 72, 74, 76 one to another for assembly, and electrically it conductive adhesive is used to further facilitate electrical contact of the fibers, spacers and cup. Adhesive layers 80, 82, 84 can be provided as distinct layers or as a monolithic body filling spaces between the overlying portions of rings 60, 62, 64; spacers 70, 72, 74, 76 and cup 30.

Spacers 70, 72, 74, 76, 78 are conductive annular bodies, such as washers, and may be metal or conductive plastics. Spacers 70, 72, 74, 76, 78 provide support for and separation between adjacent ones of base 32, microfiber rings 60, 62, 64 and membrane 50. Spacers 70, 72, 74, 76 overlie radially outer portions of microfiber rings 60, 62, 64 but do not extend radially inwardly toward antenna 14 as far as do microfiber rings 60, 62, 64.

Each microfiber ring 60, 62, 64 is formed of a plurality of generally radially extending, densely packed individual microfibers 100, only some of which are identified in the drawings for clarity. Each microfiber 100 is of sufficient length to contact and extend from antenna 14 to side 34 of cup 30. In a preferred embodiment, microfibers 100 define microfiber ring outer end portions 110, 112, 114 that are wedged between side 34 and radially outer edges of spacers 72, 74, 76 respectively. Microfibers 100 are positioned or packed together relatively tightly, to create a continuous conductive surface that extends electromagnetic shielding from housing 16 to and against antenna 14, even as antenna 14 moves. Microfibers 100 are packed sufficiently dense that no continuous space is present through the thickness of the microfiber rings. However, between the rings 60, 62, 64 spaces are provided to allow for mechanical flexing of individual microfibers 100, to facilitate contact of the microfiber rings against antenna 14 even as the shape or diameter of antenna 14 changes due to retraction or extension of the antenna. Spacers 70, 72, 74, 76 provide the desired space between the microfiber rings, between base 32 and a first adjacent microfiber ring 60 and between membrane 50 and the microfiber ring 64 nearest the membrane. Fibers 100 are positioned to contact the surface of antenna 14 and the fibers are allowed to bend against the surface of the antenna to accommodate the varying diameter, size or shape of the antenna. However, the fibers are so positioned as not to bend too severely, thus minimizing the risk of damage. The fibers of the present invention improve upon known O-ring devices for EMI shielding by being more wear resistant and by accommodating changing diameters in a retractable or other movable antenna or other device.

Each microfiber 100 is a fine, hair-like filament made from conductive material, such as, for example, carbon, stainless steel, conductive plastics such as acrylic or nylon fibers, or any other conductive fiber-type filament or other microfiber such as ceramic that can be coated with conductive materials such as copper, silver, nickel, etc.; and that can be provided with diameters sufficiently small. In a preferred embodiment, microfibers 100 generally have diameters less than about one-hundred fifty microns. In one preferred arrangement, microfibers 100 are conductive filaments having diameters within a range of about five microns to about one-hundred microns. Microfibers of this type are mechanically flexible, high-strength, high stiffness fibers that can maintain physical contact over irregular or changing surfaces. However, such fibers have ultra low friction and exhibit negligible wear from sliding contact. The individual fibers have sufficient resiliency and stiffness that when flexed against a surface the fibers will remain against the surface even if the surface is moving; however due to the light weight of each fiber the pressure of contact is low. Accordingly, wear is minimal. Microfibers 100 are provided in sufficient quantity and density within rings 60, 62, 64 to eliminate continuous axial spaces in the rings, and the use of multiple microfiber rings further enhances the continuity of the Faraday cage across opening 18 between housing 16 and antenna 14. The highly conductive nature of the microfiber material and the ability to provide densely packed fibers in a limited area facilitate use of the microfibers to continue the Faraday cage between housing 16 and antenna 14.

Figure 5:
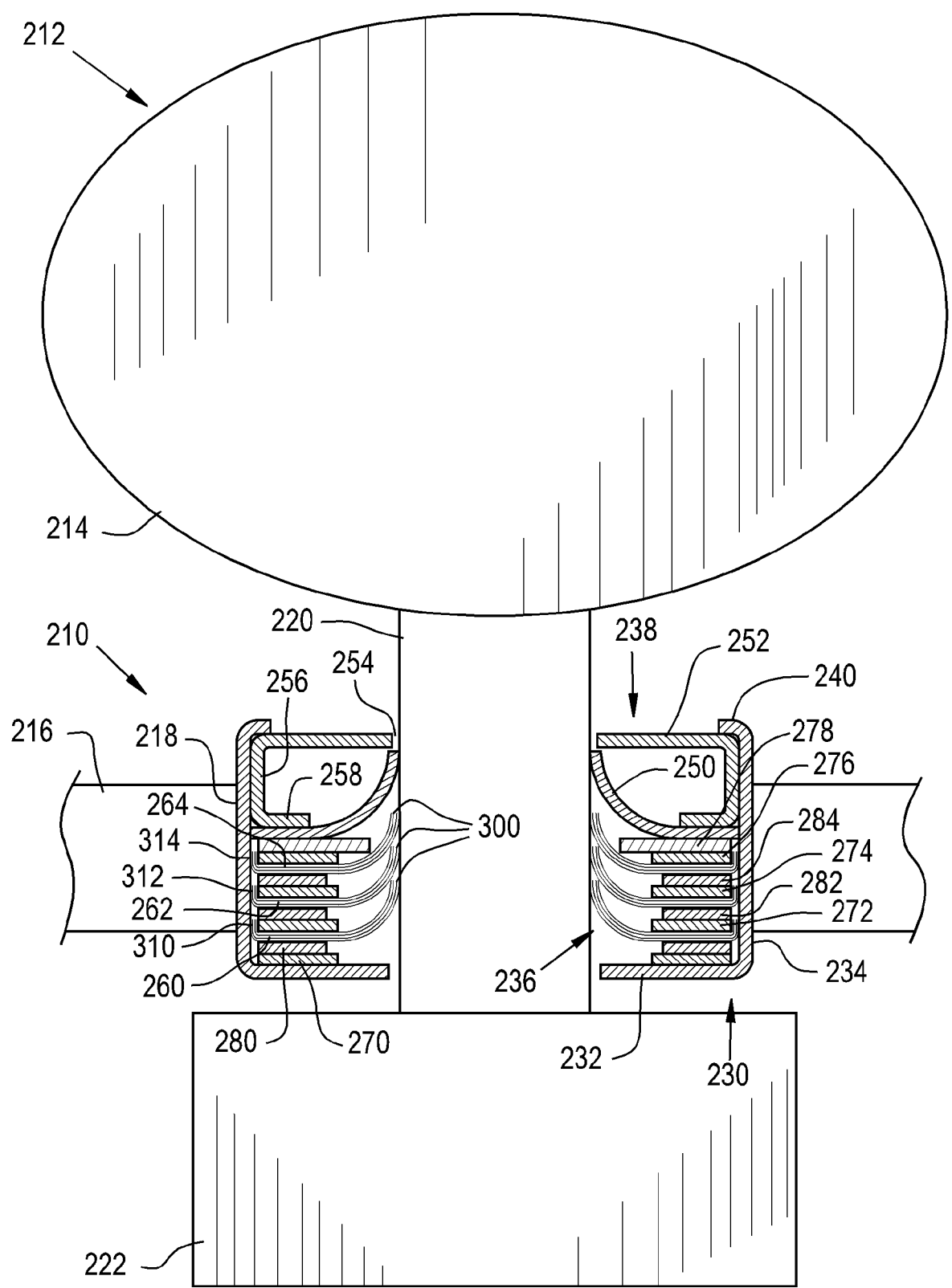
FIG. 5 is a cross-sectional view of another type of antenna having an EMI shield and environmental seal in accordance with another embodiment of the present invention.

FIG. 5 shows another embodiment of the present invention in which an EMI shielding and environmental sealing device 210 is provided for an electronic device 212 having a rotatable antenna 214. A housing 216 defines an opening 218 for a rotatable shaft 220 extending between antenna 214 and an electronics package 222. While shaft 220 does not move axially, it rotates to direct antenna 214 toward the desired target. Device 210 provides an effective EMI shield and an environmental seal between housing 216 and shaft 220 even as shaft 220 rotates.

Device 210 is similar to device 10 described previously herein. Accordingly, as described previously with respect to the corresponding parts of device 10, device 210 includes a cup 230 having a base 232 and a side 234 containing an electromagnetic shield 236 and an environmental seal 238 axially constrained by a lip 240. Seal 238 includes a membrane 250 and a cover 252 defining an opening 254 and having a side 256 and a flange 258. Electromagnetic shield 236 includes microfiber rings 260, 262, 264 alternatingly arranged with spacers 270, 272, 274, 276, 278 and secured by adhesive layers 280, 282, 284. Each microfiber ring 260, 262, 264 is comprised of a plurality of densely packed microfibers 300 having end portions 310, 312, 314 between side 234 of cup 230 and the outer edges of spacers 272, 274, 276 respectively.

Variations and modifications of the foregoing are within the scope of the present invention. It is understood that the invention disclosed and defined herein extends to all alternative combinations of two or more of the individual features mentioned or evident from the text and/or drawings. All of these different combinations constitute various alternative aspects of the present invention. The embodiments described herein explain the best modes known for practicing the invention and will enable others skilled in the art to utilize the invention. The claims are to be construed to include alternative embodiments to the extent permitted by the prior art.

Various features of the invention are set forth in the following claims.

What is claimed is:

1. An EMI shielding and environmental sealing device for an electronic device having an antenna, said EMI shielding and environmental sealing device comprising:

a cup having a side and a base;
an environmental seal restrained in said cup; and
an EMI shield restrained in said cup between said base and said environmental seal, said EMI shield including a microfiber ring of densely packed microfibers in contact with said side and with said antenna.

2. The EMI shielding and environmental sealing device of claim 1, said side being substantially annular and said microfibers extending substantially radially inwardly from said side.

3. The EMI shielding and environmental sealing device of claim 1, said side being substantially annular; and said EMI shield including a plurality of microfiber rings of densely packed microfibers extending substantially radially inwardly from and in contact with said side.

4. The EMI shielding and environmental sealing device of claim 3, including spacers between adjacent microfiber rings.

5. The EMI shielding and environmental sealing device of claim 4, said spacers being annular, and said microfibers having end portions captured between said side and outer edges of said spacers.

6. The EMI shielding and environmental sealing device of claim 5, including a spacer between said base and one of said microfiber rings; and a flexible membrane constrained in said cup on an opposite side of said microfiber rings from said base.

7. The EMI shielding and environmental sealing device of claim 6, including a spacer between said flexible membrane and one of said microfiber rings adjacent said flexible membrane.

8. The EMI shielding and environmental sealing device of claim 6, adjacent microfiber rings and spacers being connected by adhesive.

9. The EMI shielding and environmental sealing device of claim 1, microfibers of said microfiber rings having diameters less than about 150 microns.

10. The EMI shielding and environmental sealing device of claim 9, said microfibers of said microfiber rings having diameters of between about 5 microns and 100 microns.

11. An electromagnetically shielded device having a movable component, said electromagnetically shielded device comprising:

an electrically conductive housing defining an opening having the movable component of the electromagnetically shielded device extending out of said housing through said opening;
an electrically conductive cup secured in said opening, said cup having a side, a base on one edge of said side, and a lip on an opposite edge of said side;
an environmental seal in said cup restrained between said base and said lip; and
an EMI shield restrained in said cup between said base and said lip, said EMI shield including a microfiber ring of densely packed microfibers in contact with said side and with the movable component.

12. The electromagnetically shielded device of claim 11, said EMI shield including a plurality of microfiber rings overlying and spaced one from another in said cup, each microfiber ring of said plurality of microfiber rings including densely packed microfibers in contact with said side and with the movable component.

13. The electromagnetically shielded device of claim 12, said microfibers having diameters less than about 150 microns.

14. The electromagnetically shielded device of claim 11, the movable component being an antenna.

* * * * *